United States Patent
Cai et al.

(10) Patent No.: US 9,350,325 B2
(45) Date of Patent: May 24, 2016

(54) REDUCED DYNAMIC POWER D FLIP-FLOP

(75) Inventors: Yanfei Cai, Shanghai (CN); Shuangqu Huang, Shanghai (CN); Qiang Dai, Shanghai (CN)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 14/403,293

(22) PCT Filed: May 30, 2012

(86) PCT No.: PCT/CN2012/076259
§ 371 (c)(1),
(2), (4) Date: Apr. 16, 2015

(87) PCT Pub. No.: WO2013/177759
PCT Pub. Date: Dec. 5, 2013

(65) Prior Publication Data
US 2015/0236676 A1    Aug. 20, 2015

(51) Int. Cl.
*H03K 3/012* (2006.01)
*H03K 3/356* (2006.01)

(52) U.S. Cl.
CPC .............. *H03K 3/012* (2013.01); *H03K 3/356* (2013.01)

(58) Field of Classification Search
None
See application file for complete search history.

(56) References Cited

U.S. PATENT DOCUMENTS

| 7,123,068 | B1 * | 10/2006 | Hoover ............. H03K 3/35625 327/202 |
| 7,138,842 | B2 * | 11/2006 | Padhye ............... H03K 3/0375 327/203 |
| 7,405,606 | B2 | 7/2008 | Tam et al. |
| 8,076,965 | B2 | 12/2011 | Djaja et al. |
| 8,115,531 | B1 | 2/2012 | Brown et al. |
| 2008/0238473 | A1 | 10/2008 | Zounes |
| 2011/0298517 | A1 | 12/2011 | Pal |

* cited by examiner

*Primary Examiner* — Long Nguyen
(74) *Attorney, Agent, or Firm* — Bay Area Technology Law Group PC

(57) ABSTRACT

A CMOS D-type flip flop (D-FF) exhibits reduced power consumption by selectively disabling certain charging/discharging operations at specific circuit elements to minimize the capacitance of the circuit's internal nodes using a partial signaling technique. A clock inverter module may be used to provide a partial inverse clock signal that is the complement of a clock signal when a non-clock dependent input to the clock inverter module has a first value and to provide a fixed signal when the non-clock dependent signal has a second value. One or more MOSFETs controlled by the partial inverse clock signal do not charge or discharge when the non-clock dependent signal has the second value.

17 Claims, 6 Drawing Sheets

REDUCED DYNAMIC POWER D FLIP-FLOP

FIELD OF THE PRESENT INVENTION

This disclosure generally relates to sequential logic circuits and more specifically to flip-flop circuits having reduced dynamic power requirements.

BACKGROUND OF THE INVENTION

Flip-flops are fundamental elements used in the design of digital circuits. In general, a D flip-flop has an input signal D and an output signal Q. The output signal stores the previous value of the input signal until the circuit is triggered by a clock signal at which point Q takes on the current value of D.

Reducing dynamic power is an important criteria in the design of integrated circuits. As clock frequencies are increased to provide enhanced operating speeds, the importance of reducing the power usage associated with switching transistors is emphasized. For example, in current designs, more than half of the total dynamic power is associated with the operation of flip-flops and the clock networks.

FIG. 1 shows one embodiment of a prior art D flip-flop 100 having a master-slave configuration. Inverter 102 samples the input signal D and outputs it through pass gate 104 to the master latch formed by a feedback loop between inverter 106 and tri-state inverter 108. At the rising edge of a clock signal, CK, pass gate 110 feeds the value stored in the master latch to the slave latch formed by inverter 112 and tri-state inverter 114. The value held in the slave latch is output through inverter 116 as the signal Q. As shown, pass gates 104 and 110 as well as tri-state inverters 108 and 114 are controlled by the clock signal CK and an inverse clock signal CKB, which may be generated from the clock signal by inverter 118.

The power consumption of D flip-flop 100 is directly related to the number of transistors that switch states with the clock signal. This is a primary source of dynamic power usage of the flip-flop and corresponds to the charging and discharging of the internal and output capacitance of the transistor gates. The switching power per clock cycle of a given circuit may be represented by Equation (1):

$$\text{Energy/transition} = (C_{load} + C_{internal}) * V^2 / 2 \quad (1)$$

As will be appreciated, if the load capacitance is fixed, reducing the switching power, and correspondingly, the dynamic power, of a circuit requires a reduction in the capacitance of the internal nodes of the transistors comprising the circuit such as by reducing the number of switching operations.

Conventional methods for reducing the switching power involve clock-gating individual flip-flops within a circuit. However, these techniques significantly increase the complexity, and therefore cost, of the circuit. Further, the prior art clock-gating methods may also actually increase the dynamic power consumed when circuit activity is high, leading to greater power consumption as compared to non-gated flip-flops at corresponding activity levels.

Accordingly, what has been needed are systems and methods for implementing D flip-flops having reduced dynamic power. It would also be desirable to provide D flip-flops that provide the reduction in power without sacrificing accuracy or significantly slowing operation. Likewise, it would be desirable to provide reduced dynamic power consumption even at high activity levels. This specification discloses systems and methods for accomplishing these and other goals.

SUMMARY OF THE INVENTION

In accordance with the above needs and those that will be mentioned and will become apparent below, this specification discloses a D flip-flop having an input D and an output Q including a plurality of MOSFETs and a clock inverter module receiving a clock signal and a non-clock dependent signal as inputs and outputting a partial inverse clock signal, wherein at least one of the MOSFETs has a gate connected to the partial inverse clock signal and the clock inverter module is configured to output the partial inverse clock signal such that it may be a complement of the clock signal when non-clock dependent signal has a first value and may be a fixed value when non-clock dependent signal has a second value, so that the at least one MOSFET having a control input connected to the partial inverse clock signal does not charge or discharge when the non-clock dependent has the second value. Preferably, the clock inverter module may be a NAND gate or may be configured to perform a NAND-like logical operation. Alternatively, the clock inverter module is configured to perform a NOR-like logical operation.

In one aspect, the non-clock dependent signal may be the input D. In such embodiments, the clock inverter module may be configured to perform a NAND-like logical operation so that the partial inverse clock signal has the fixed value of 1 when the first value of D is 0.

In another aspect, the non-clock dependent signal may be an output signal of the D flip-flop. For example, when the D flip-flop includes a master latch for holding the D input and slave latch for holding the Q output, the non-clock dependent signal may be a last state stored by the slave latch. In one embodiment, the clock inverter module may be configured to perform a NAND-like logical operation so that the partial inverse clock signal has the fixed value of 1 when the last state stored by the slave latch has a value of 0.

This disclosure also includes a method for operating a D flip-flop having an input D and an output Q and a plurality of MOSFETs, including the steps of providing a partial inverse clock signal such that the partial inverse clock signal is the complement of a clock signal when a non-clock dependent signal has a first value and is a fixed value when the non-clock dependent signal has a second value and controlling at least one of the MOSFETs with the partial inverse clock signal so that the MOSFET does not charge or discharge when the non-clock dependent signal has the second value. Preferably, the partial inverse clock signal may be provided by performing a NAND-like or a NOR-like logical operation on the inputs of the clock signal and the non-clock dependent signal.

In one aspect, the non-clock dependent signal may be the input D. Further, the partial inverse clock signal may be generated by performing a NAND-like logical operation so that the partial inverse clock signal has the fixed value of 1 when the first value of D is 0.

In another aspect, the non-clock dependent signal may be an output signal of the D flip-flop. In embodiments wherein the D flip-flop includes a master latch for holding the D input and slave latch for holding the Q output, the non-clock dependent signal may be a last state stored by the slave latch. Further, the partial inverse clock signal may be generated by performing a NAND-like logical operation so that the inverse clock signal has the fixed value of 1 when the last state stored by the slave latch has a value of 0.

BRIEF DESCRIPTION OF THE DRAWINGS

Further features and advantages will become apparent from the following and more particular description of the preferred embodiments of the invention, as illustrated in the accompanying drawings, and in which like referenced characters generally refer to the same parts or elements throughout the views, and in which.

DETAILED DESCRIPTION OF THE INVENTION

Figure 1:
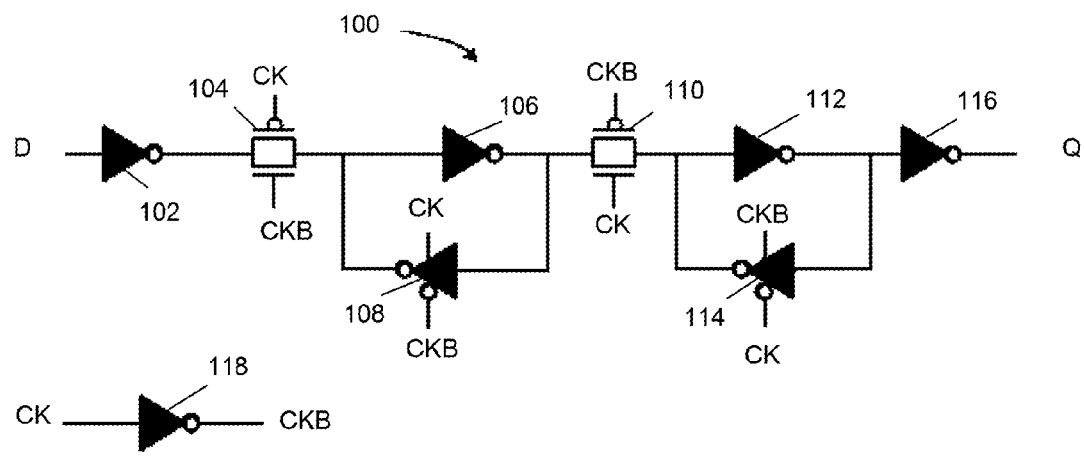
FIG. 1 depicts a D flip-flop circuit representing the prior art.

At the outset, it is to be understood that this disclosure is not limited to particularly exemplified materials, architectures, routines, methods or structures as such may, of course, vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the invention in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

"Complementary logic," which refers to logic circuitry involving both P-channel and N-channel transistors, is often more commonly referred to as CMOS (Complementary Metal Oxide Semiconductor) logic even though the transistors making up the logic circuitry may not have metal gates and may not have oxide gate dielectrics.

The terms second level and first level, high and low and 1 and 0, as used in the following description may be used to describe various logic states as known in the art. Particular voltage values of the second and first levels are defined arbitrarily with regard to individual circuits. Furthermore, the voltage values of the second and first levels may be defined differently for individual signals such as a clock and a digital data signal. Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" or low and high in certain locations, one skilled in the art appreciates that the logical values can be switched, with the remainder of the circuit adjusted accordingly, without affecting operation of the present invention.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

Unless defined otherwise, all technical and scientific terms used herein have the same meaning as commonly understood by one having ordinary skill in the art to which the disclosure pertains.

Further, all publications, patents and patent applications cited herein, whether supra or infra, are hereby incorporated by reference in their entirety.

Finally, as used in this specification and the appended claims, the singular forms "a, "an" and "the" include plural referents unless the content clearly dictates otherwise.

To reduce the amount of power consumed by a CMOS D-type flip flop (D-FF), this specification is directed to circuit designs that selectively disable certain charging/discharging operations at specific circuit elements to minimize the capacitance of the circuit's internal nodes using a partial signaling technique. A clock inverter module may be used to provide a partial inverse clock signal that is the complement of a clock signal when a non-clock dependent input to the clock inverter module has a first value and to provide a fixed signal when the non-clock dependent signal has a second value. For example, in a partial single phase embodiment, the non-clock dependent signal may be the D input signal and in a partial gating embodiment, the non-clock dependent signal may be the inverse of the Q output signal.

Figure 2:
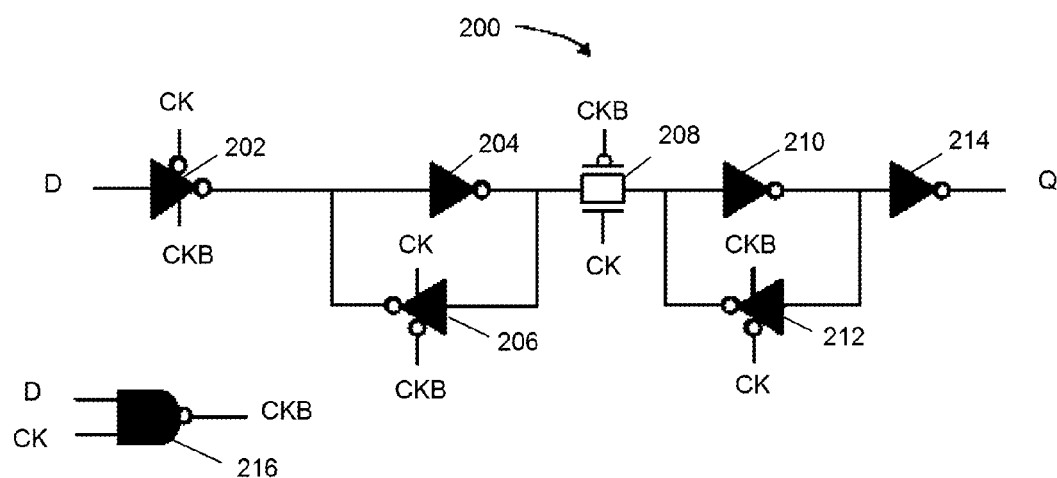
FIG. 2 depicts a D flip-flop having partial single phase signaling, according to one embodiment of the invention.

In a first embodiment, D flip-flop 200 is shown in FIG. 2 and is configured to use a partial single phase clock signal generated by a clock inverter module. Input signal D is sampled by tri-state inverter 202 and fed to a master latch formed by a feedback loop between inverter 204 and tri-state inverter 206 when the clock signal is low. At the rising edge of the clock signal, tri-state inverter 202 disconnects D flip-flop 200 from the input, while pass gate 208 is enabled to deliver the value of D stored in the master latch to the slave latch, formed by the feedback loop between inverter 210 and tri-state inverter 212. The value held in the slave latch is output from inverter 214 as the output signal Q. The clock inverter module for providing the partial single phase signal may include NAND gate 216 having input signal D and the clock signal CK as inputs, outputting a partial inverse CKB signal as described below.

Figure 3:
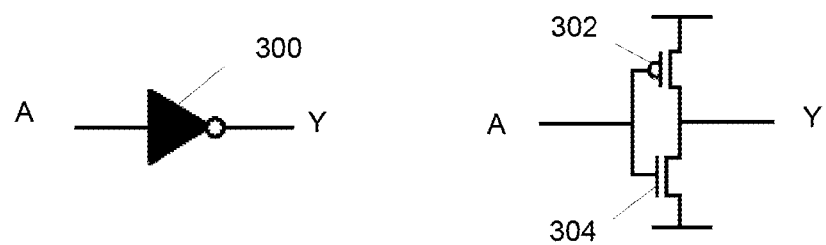
FIG. 3 depicts an inverter logic gate and a suitable corresponding MOSFET implementation.
Figure 4:
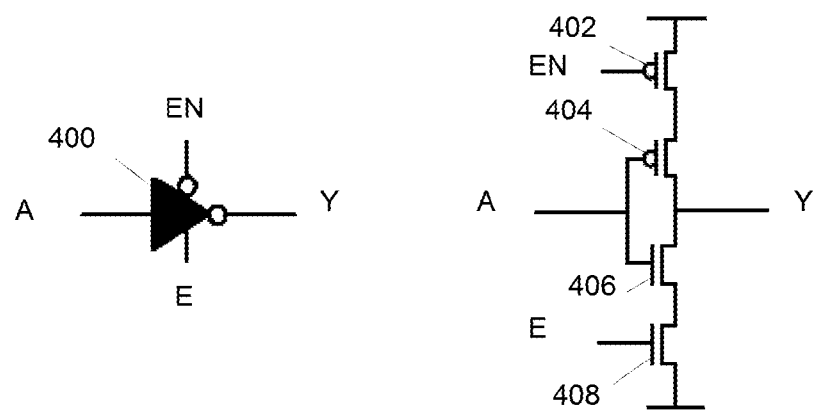
FIG. 4 depicts a tri-state inverter and a suitable corresponding MOSFET implementation.
Figure 5:
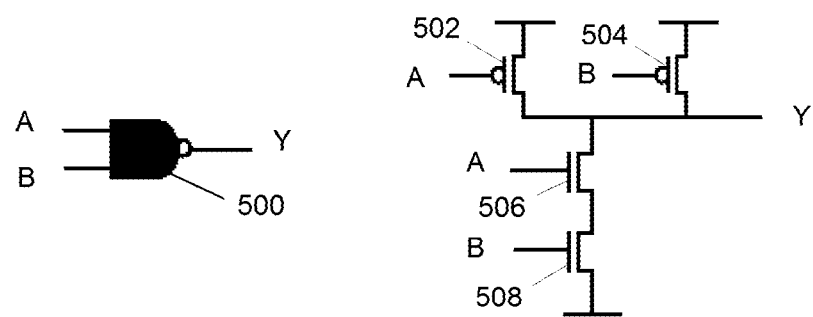
FIG. 5 depicts a NAND gate and a suitable corresponding MOSFET implementation.

FIGS. 3-5 show suitable CMOS implementations of the logic gates employed in D flip-flop 200. As depicted in FIG. 3, inverter 300 having an input A and output Y may be implemented by a p-type metal oxide semiconductor field effect transistor (PMOSFET) 302 and an n-type MOSFET (NMOSFET) 304, such that the gates of PMOSFET 302 and NMOSFET 304 are connected to input A. The output Y may be taken from the node at the drains of PMOSFET 302 and NMOSFET 304. FIG. 4 depicts a tri-state inverter 400 formed from two PMOSFETs 402 and 404 and two NMOSFETs 406 and 408. PMOSFET 404 and NMOSFET 406 are connected in the inverter arrangement discussed above with regard to FIG. 3, including the input A and output Y. However, the source of PMOSFET 404 is coupled to the drain of PMOSFET 402 which is gated by signal EN, while the source of NMOSFET 406 is connected to the drain of NMOSFET 408 which is gated by signal E. Finally, FIG. 5 shows NAND gate 500 that may be implemented using PMOSFETs 502 and 504 connected in parallel and gated by input signals A and B, respectively, such that their drains are connected to the drain of NMOSFET 506, the source of which is connected to the drain of NMOSFET 508. Signal A gates NMOSFET 506 and signal B gates NMOSFET 508. The output Y may be taken from the node formed by the drains of PMOSFETs 502 and 504 and NMOSFET 506.

In operation, the partial inverse signal CKB generated by NAND gate 216 is given by the truth table in Table 1.

TABLE 1

| D | CK | CKB |
|---|----|-----|
| 0 | 0  | 1   |
| 0 | 1  | 1   |
| 1 | 0  | 1   |
| 1 | 1  | 0   |

As can be seen, when D is low, the CKB signal is high, regardless of the signal from CK. When D is high, the CKB signal is the inverse of the CK signal. As a result, when D is low, only the CK signal is used to charge and discharge the MOSFETs of tri-state inverters 202, 206 and 212 and pass gate 208. This requires the switching of 6 MOSFETs, one in each of tri-state inverters 202, 206 and 212 as indicated by FIG. 4, 2 in NAND gate 216 as indicated by FIG. 5, and the NMOSFET half of pass gate 208. Accordingly, 4 MOSFETs receiving the CKB signal, do not charge or discharge, three from tri-state inverters 202, 206 and 212 and the PMOSFET half of pass gate 208. In turn, when D is high, all the MOSFETs receiving CK and CKB signals switch with each clock pulse to prevent the loss of threshold voltage.

Figure 6:
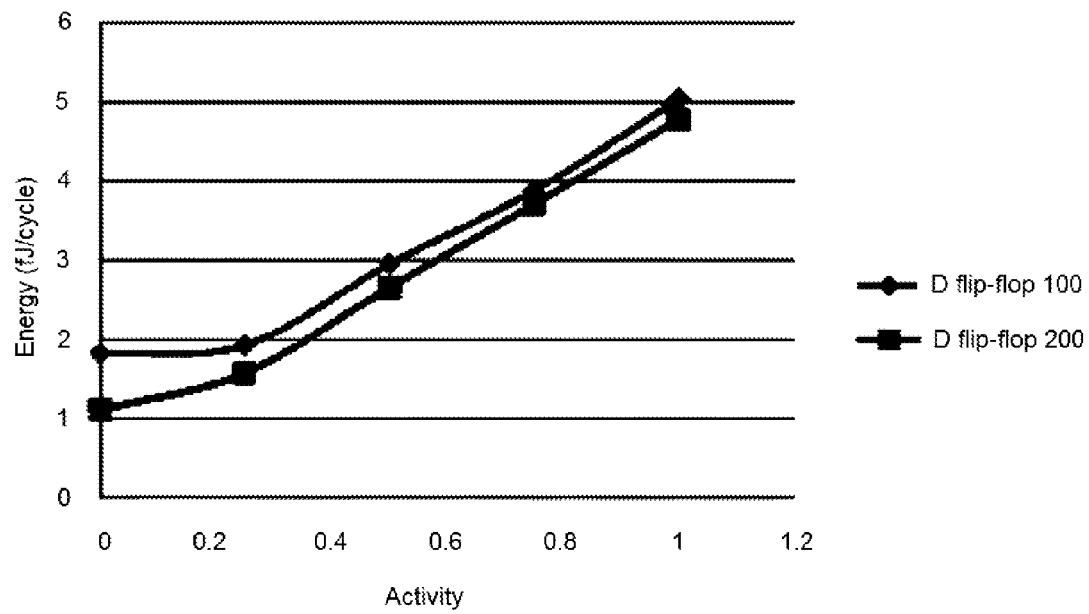
FIG. 6 is a graph of the absolute power consumption of a conventional D flip-flop and a D flip-flop having partial single phase signaling, according to one embodiment of the invention.
Figure 7:
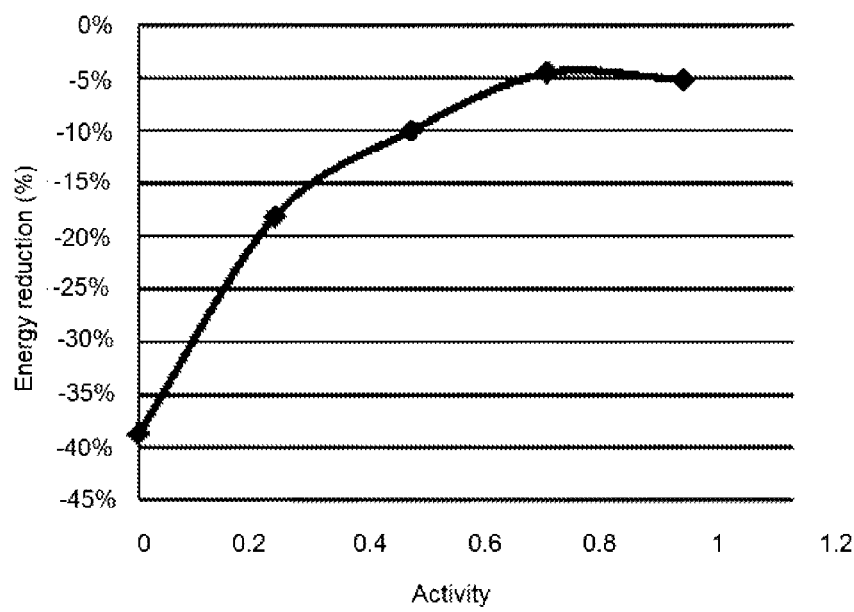
FIG. 7 is a graph of the relative power consumption of the partial single phase D flip-flop of FIG. 6 compared to a conventional D flip-flop, according to one embodiment of the invention.

When considered in comparison to D flip-flop 100 of the prior art, D flip-flop 200 requires 26 MOSFET elements rather than 24. However, this modest increase in circuit elements is offset by an approximately 40% reduction in switching power dissipated when D is low. FIG. 6 is a graph showing the absolute energy per cycle consumption of D flip-flop 100 and D flip-flop 200 at varying activity levels taken during average operating conditions. The activity is represented by the average number of transitions in D occurring per clock cycle, thus having a nominal maximum of 1. In turn, FIG. 7 shows the energy savings indicated in FIG. 6 with regard to D flip-flop 200 relative to D flip-flop 100. As can be seen, the power savings may range from approximately 40% at lower activity levels to approximately 5% at high activity levels. Even though the power savings decreases as the activity level rises, there is still a net power savings associated with employing D flip-flops with the partial single phase signaling.

Figure 8:
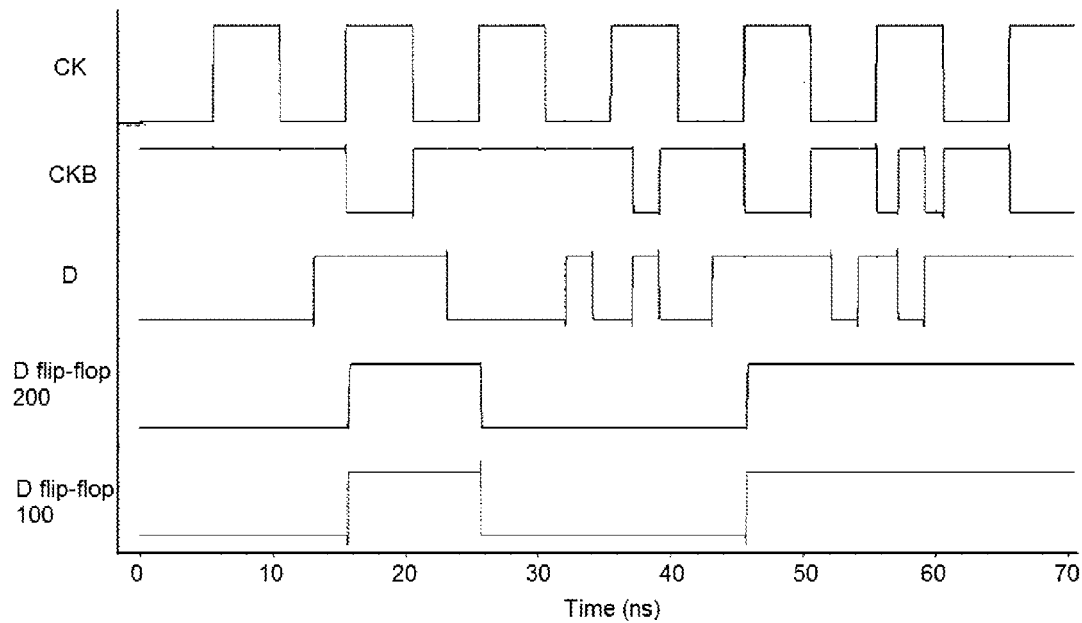
FIG. 8 depicts the waveforms of a partial single phase D flip-flop compared to a conventional D flip-flop, showing the corresponding input, output and clock signals, according to one embodiment of the invention.

D flip-flop 200 also provides accurate operation as shown in the graph of FIG. 8, which compares the waveform simulations of the output from D flip-flop 100 and D flip-flop 200 relative to the input D while under the control of clock signals CK and CKB. The partial inverse CKB signal shown corresponds to the partial single phase signal discussed above as provided by the output of NAND gate 216, rather than the conventional inverted clock signal used to drive D flip-flop 100. The distinction may be appreciated by recognizing the CKB changes state only when D is high. As can be seen, the performance of D flip-flop 200 matches D flip-flop 100. No output failures are indicated, even in the presence of glitches in the D signal, represented by the multiple state changes within a single clock pulse of the CK signal.

Figure 9:
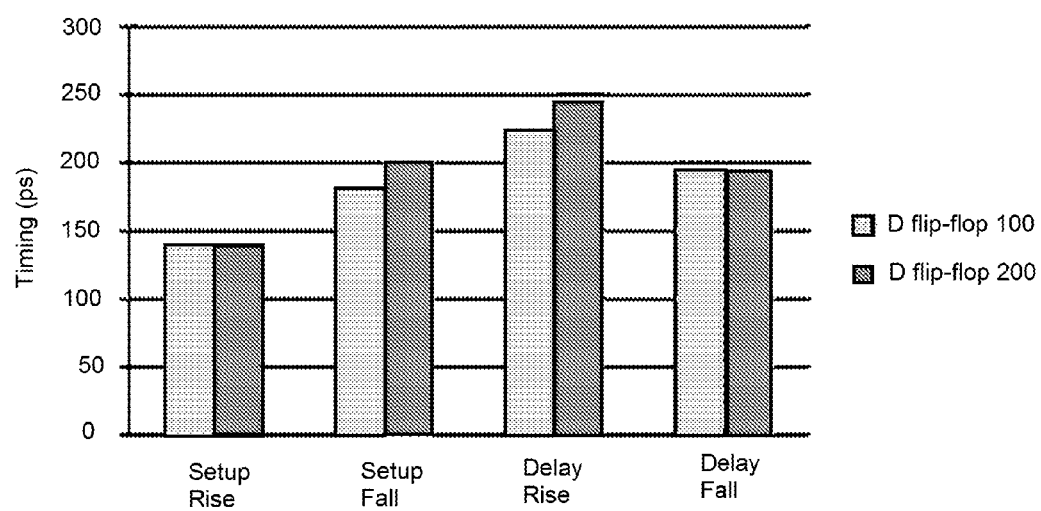
FIG. 9 is a graph of the timing of a conventional D flip-flop and a partial single phase D flip-flop, according to one embodiment of the invention.

A further comparison between D flip-flop 100 and D flip-flop 200 with regard to timing is shown in the graph of FIG. 9. The results show equivalent timing performance between D flip-flop 100 and D flip-flop 200 in the setup rise and delay fall conditions and slightly slower transitions at the setup fall and delay rise conditions. These tests were conducted at a slow-slow process corner, undervolted and at −40° C. which may be taken to represent conditions likely to maximize any reductions timing performance. As will be appreciated, the minimal delays introduced by employing the partial single phase signaling may be offset by the power savings.

Figure 10:
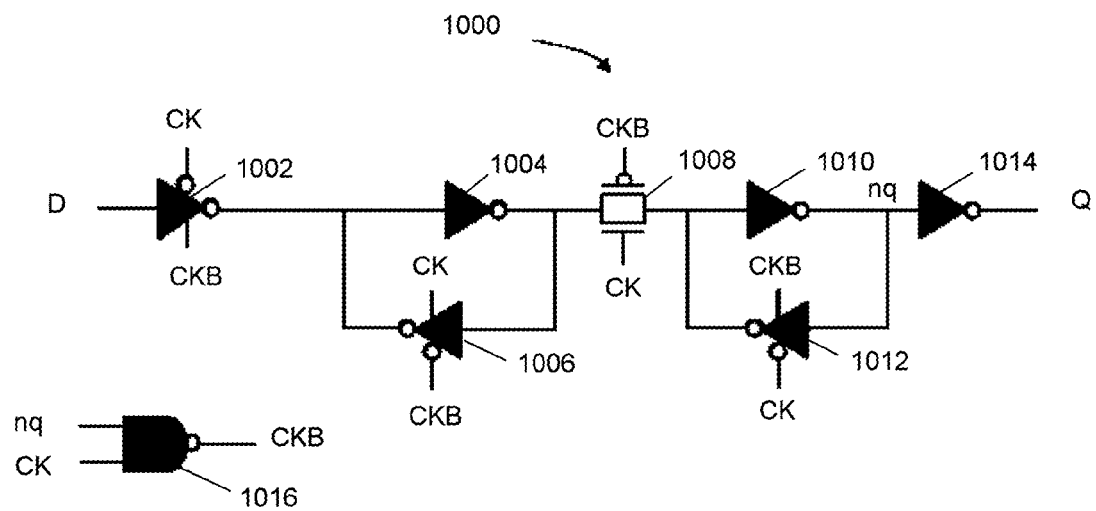
FIG. 10 depicts a D flip-flop having partial gating signaling, according to one embodiment of the invention.

In another aspect, the clock inverter module may provide a partial inverse clock signal using an output signal as the non-clock dependent signal rather than the input signal D. In the embodiment shown in FIG. 10, a partial gating signal is based on the last state stored in the slave latch to selectively suppress the charging and/or discharging of specific MOSFETs comprising D flip-flop 1000. As shown, input signal D is sampled by tri-state inverter 1002 and fed to a master latch formed by a feedback loop between inverter 1004 and tri-state inverter 1006 when the clock signal is low. At the rising edge of the clock signal, tri-state inverter 1002 disconnects D flip-flop 1000 from the input, while pass gate 1008 is enabled to deliver the value of D stored in the master latch to the slave latch, formed by the feedback loop between inverter 1010 and tri-state inverter 1012. The value held in the slave latch is output from inverter 1014 as the output signal Q. The clock inverter module for providing the partial gating signal may include NAND gate 1016 having nq and the clock signal CK as inputs, outputting the partial inverse CKB signal. As shown, the nq signal may be taken from the node at the input of inverter 1014. Different embodiments may be directed to the use of other suitable input or output signals which may be buffered or inverted as desired.

Figure 11:
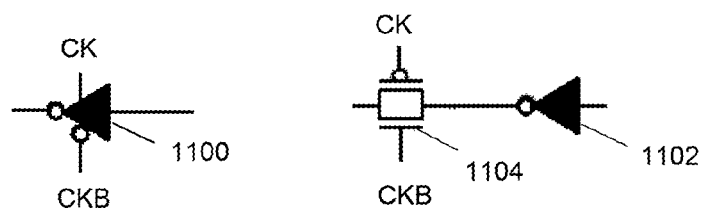
FIG. 11 depicts a tri-state inverter and an alternative implementation.

The operation of D flip-flop 1000 is analogous to that of D flip-flop 200, as described above. Generally, when Q is high, nq is low and the corresponding CKB signal is high, regardless of the signal from CK. In turn, when nq is high, the CKB signal is the normal inverse of the CK signal. As a result, when nq is low, only the CK signal is used to charge and discharge the MOSFETs of tri-state inverters 1002, 1006 and 1012 and pass gate 1008 and the complementary MOSFETs receiving the CKB signal do not charge or discharge. When nq is high, all the MOSFETs receiving CK and CKB signals switch with each clock pulse to prevent the loss of threshold voltage In further embodiments, one or more of the tri-state inverters employed in FIGS. 2 and 10, for example, may be substituted with an inverter and pass-gate combination. FIG. 11 shows the equivalent blocks including either tri-state inverter 1100 or inverter 1102 coupled to pass gate 1104.

Figure 12:
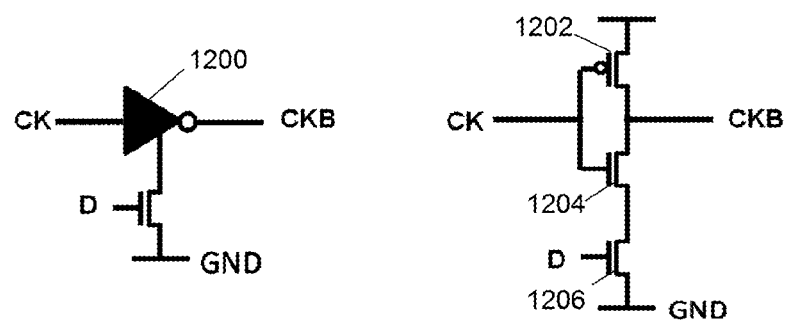
FIG. 12 depicts a NAND-like gate and a suitable corresponding MOSFET implementation for use according to one embodiment of the invention.

As one of skill in the art will recognize, other equivalent substitutions may be made in the D flip-flop circuits as desired. For example, an alternate embodiment for the clock inverter module configured to generate the partial inverse clock CKB signal is shown in FIG. 12. Rather than NAND gate 216, a modified inverter 1200 having a suitable MOSFET implementation may be employed. As shown PMOSFET 1202 and NMOSFET 1204 are coupled in a conventional inverter configuration, such that both are gated by the CK signal and output CKB at the node between their drains. The source of NMOSFET 1204 is connected to the drain of NMOSFET 1206, which is gated by D. This NAND-like arrangement has the same truth table as NAND gate 216, allowing a clock inverter module having this circuit to be used as desired to generate the partial inverse CKB signals. Other NAND-like circuits may also be employed.

Figure 13:
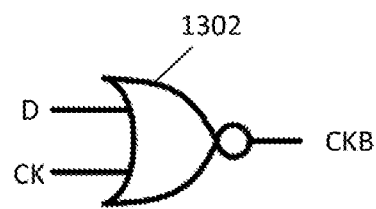
FIG. 13 depicts a clock module configured to perform a NOR-like logical operation according to one embodiment of the invention.

In the embodiments discussed above, the partial inverse clock signal CKB signal produced by clock inverter module may be generated using a NAND gate. However, one of skill in the art will recognize the a NOR gate outputs the logical inverse of a NAND gate and may be used to provide a modified clock signal CKB that may provide an equivalent degree of selective control over the MOSFETs implemented in the D flip-flops of the invention. As such, NOR MOSFET configurations or NOR-like circuits may be used by the clock inverter module as desired. An exemplary clock inverter module 1302 is schematically shown in FIG. 13 that is configured to perform a NOR-like logical operation.

In a further aspect, different or more complex logic circuits having MOSFETs with inverse clock signals inputs can be modified in similar manners, using one or a combination of the partial single phase and partial gating control signals, or other non-clock dependent signals as desired.

Described herein are presently preferred embodiments. However, one skilled in the art that pertains to the present invention will understand that the principles of this disclosure can be extended easily with appropriate modification.

What is claimed is:

1. A D flip-flop having an input D and an output Q comprising a plurality of MOSFETs and a clock inverter module receiving a clck signal and a non-clock dependent signal as inputs and outputting a partial inverse clock signal, wherein at least one of the MOSFETs has a gate connected to the partial inverse clock signal and the clock inverter module is configured to output the partial inverse clock signal such that the partial inverse clock signal comprises a complement of the clock signal when the non-clock dependent signal has a first value and has a fixed value when the non-clock dependent signal has a second value, so that the at least one MOSFET having a control input connected to the partial inverse clock signal does not charge or discharge when the non-clock dependent signal has the second value, wherein the non-clock dependent signal is selected from the group consisting of the input D and an output signal of the D flip-flop.

2. The D flip-flop claim 1, wherein the clock inverter module is configured to perform a NAND-like logical operation.

3. The D flip-flop of claim 2, wherein the clock inverter module comprises a NAND gate.

4. The flip-flop of claim 1, wherein the clock inverter module is configured to perform a NOR-like logical operation.

5. The flip-flop of claim 1, wherein the non-clock dependent signal comprises the input D.

6. The D flip-flop of claim 5, wherein the clock inverter module is configured to perform a NAND-like logical operation so that the partial inverse clock signal has the fixed value of 1 when the first value of input D is 0.

7. The D flip-flop of claim 1, wherein the non-clock dependent signal comprises the output signal of the D flip-flop.

8. The D flip-flop of claim 7, wherein the D flip-flop further comprises a master latch for holding the input D and slave latch for holding the output Q, wherein the non-clock dependent signal comprises a last state stored by the slave latch.

9. The D flip-flop of claim 8, wherein the clock inverter module is configured to perform a NAND-like logical operation so that the partial inverse clock signal has the fixed value of 1 when the last state stored by the slave latch has a value of 0.

10. A method for operating a D flip-flop having an input D and an output Q and a plurality of MOSFETs, comprising;
 a) providing a partial inverse clock signal such that the partial inverse clock signal is a complement of a clock signal when a non-clock dependent signal has a first value and is a fixed value when the non-clock dependent signal has a second value, wherein the non-clock dependent signal is selected from the group consisting of the input D and an output signal of the D flip-flop:
 b) controlling at least one of the MOSFETs with the partial inverse clock signal so that the at least one MOSFET does not charge or discharge when the non-clock dependent signal has the second value.

11. The method of claim 10, wherein providing the partial inverse clock signal comprises performing a NAND-like logical operation on the inputs of the clock signal and the non-clock dependent signal.

12. The method of chum 11, wherein providing the partial inverse clock signal comprises performing a NOR-like logical operation on the inputs of the clock signal and the non-clock dependent signal.

13. The method or claim 10, wherein the non-clock dependent signal comprises the Input D.

14. The method of claim 13. wherein providing the partial inverse clock signal comprises performing a NAND-like logical operation so hat the partial inverse clock signal has the fixed value of 1 when the first value of input D is 0.

15. The method of claim 10, wherein the non-clock dependent signal comprises the output signal of the D flip-flop.

16. The method of claim 15, wherein the D flip-flop further comprises a master latch for holding the input D and slave latch for holding the output Q. wherein the non-clock dependent signal comprises a last state stored h the slave latch.

17. The method of claim 16, wherein providing the partial inverse clock signal comprises performing a NAND-like logical operation so that the partial inverse clock signal has the fixed value of 1 when the last state stored by the slave latch has a value of 0.

* * * * *